US006452260B1

(12) United States Patent
Corbin et al.

(10) Patent No.: US 6,452,260 B1
(45) Date of Patent: Sep. 17, 2002

(54) ELECTRICAL INTERFACE TO INTEGRATED CIRCUIT DEVICE HAVING HIGH DENSITY I/O COUNT

(75) Inventors: Dave B. Corbin, Los Altos Hills, CA (US); Eric Bogatin, Olathe, KS (US)

(73) Assignee: Silicon Light Machines, Sunnyvale, CA (US)

( * ) Notice: Subject to any disclaimer, the term of this patent is extended or adjusted under 35 U.S.C. 154(b) by 0 days.

(21) Appl. No.: 09/500,118

(22) Filed: Feb. 8, 2000

Related U.S. Application Data

(62) Division of application No. 08/920,122, filed on Sep. 2, 1997, now Pat. No. 6,096,576.

(51) Int. Cl.$^7$ .............................................. H01L 23/02
(52) U.S. Cl. ..................... 257/686; 257/724; 257/738; 257/776; 257/777; 257/780; 361/720; 361/748; 361/792
(58) Field of Search ............................. 257/723, 724, 257/777, 779, 780, 781, 685, 686, 737, 738, 773, 776; 361/720, 748, 792

(56) References Cited

U.S. PATENT DOCUMENTS

| 3,256,465 A | 6/1966 | Weissenstern et al. ...... 317/101 |
| 3,388,301 A | 6/1968 | James ........................ 317/234 |
| 3,657,610 A | 4/1972 | Yamamoto et al. ......... 317/234 |

(List continued on next page.)

FOREIGN PATENT DOCUMENTS

| DE | 32 33 195 A1 | 3/1983 | ........... H01L/23/52 |
| DE | 43 23 799 A1 | 1/1994 | ........... H01L/21/58 |
| EP | 0 089 044 A2 | 9/1983 | ........... H01L/23/10 |

(List continued on next page.)

OTHER PUBLICATIONS

"DTO Offers Low Cost Display Driver Packaging," Diamond Tech One, Inc.
"Integrated Circuit Chip Package," C.N. Liu et al., IBMTDB, vol. 17, No. 7, Dec. 1974; p. 2018, Doc. #XP002076742.
Patent Abstracts of Japan, vol. 017, No. 586, (P–1633), Oct. 1993, & JP 05 173160 A (Seiko Epson Corp.), Jul. 1993.
Patent Abstracts of Japan, vol. 018, No. 612 (P–1829), Nov. 1994, & JP 06 230405 A (Nec Corp.), Aug. 1994.
Patent Abstracts of Japan, vol. 096, No. 004, Apr. 1996, & JP 07 321152 A (Citizen Watch Co. LTD.), Dec. 1995.

Primary Examiner—Kamand Cuneo
Assistant Examiner—Alonzo Chambliss
(74) Attorney, Agent, or Firm—Haverstock & Owens LLP

(57) ABSTRACT

A method of and an apparatus for electrically interconnecting two integrated circuits devices includes mounting the two devices face to face. A first device is mounted for example to a substrate or lead frame. The first device includes a plurality of electrical/physical mounting structures preferably positioned along one edge. The mounting structure provide both electrical interconnection and physical mounting. A second device includes a corresponding plurality of mounting structures configured as a mirror image of the mounting structures on the first device. The mounting structures on the second device are also positioned along one of its edges so that once the mounting structures are brought together in a face to face relationship, the second device cantilevers off the edge of the first device. Under certain circumstances, a dummy block can be mounted to the substrate adjacent to the first device to act as a strut or support for the second device. The mounting structures can be positioned sufficiently close to one another that surface area consumed for I/O is minimized. Another set of electrical interconnect structures can be formed on the surface of the second device on the edge opposite the mounting structures. Electrical connection can be formed to these electrical interconnect structures using conventional techniques such as tape automated bonding.

12 Claims, 3 Drawing Sheets

U.S. PATENT DOCUMENTS

| | | | |
|---|---|---|---|
| 3,811,186 A | 5/1974 | Larnerd et al. | 29/626 |
| 3,871,014 A | 3/1975 | King et al. | 257/779 |
| 3,942,245 A | 3/1976 | Jackson et al. | 29/591 |
| 4,012,835 A | 3/1977 | Wallick | 29/591 |
| 4,021,766 A | 5/1977 | Aine | 338/2 |
| 4,034,399 A | 7/1977 | Drukier et al. | 257/275 |
| 4,103,273 A | 7/1978 | Keller | 338/2 |
| 4,190,855 A | 2/1980 | Inoue | 257/668 |
| 4,355,463 A | 10/1982 | Burns | 29/827 |
| 4,417,386 A | 11/1983 | Exner | 29/590 |
| 4,426,768 A | 1/1984 | Black et al. | 29/583 |
| 4,467,342 A | 8/1984 | Tower | 257/443 |
| 4,545,610 A | 10/1985 | Lakritz et al. | 29/589 |
| 4,700,276 A | 10/1987 | Freyman et al. | 361/403 |
| 4,717,066 A | 1/1988 | Goldenberg et al. | 228/179 |
| 4,721,629 A | 1/1988 | Sakai et al. | 427/35 |
| 4,804,641 A | 2/1989 | Artl et al. | 438/465 |
| 4,807,021 A | 2/1989 | Okumura | 257/777 |
| 4,811,082 A | 3/1989 | Jacobs et al. | 257/700 |
| 4,817,850 A | 4/1989 | Wiener-Avnear et al. | 228/119 |
| 4,897,708 A | 1/1990 | Clements | 357/65 |
| 4,926,241 A | 5/1990 | Carey | 257/698 |
| 4,949,148 A | 8/1990 | Bartelink | 257/785 |
| 4,970,575 A | 11/1990 | Soga et al. | 257/786 |
| 4,982,265 A | 1/1991 | Watanabe et al. | 257/737 |
| 4,999,308 A | 3/1991 | Nishiura et al. | 438/80 |
| 5,039,628 A | 8/1991 | Carey | 438/107 |
| 5,040,052 A | 8/1991 | McDavid | 361/793 |
| 5,041,395 A | 8/1991 | Steffen | 438/118 |
| 5,066,614 A | 11/1991 | Dunaway et al. | 438/117 |
| 5,068,205 A | 11/1991 | Baxter et al. | 438/49 |
| 5,074,947 A | 12/1991 | Estes et al. | 156/307.3 |
| 5,075,940 A | 12/1991 | Kuriyama et al. | 29/25.03 |
| 5,093,281 A | 3/1992 | Eshima | 438/117 |
| 5,137,836 A | 8/1992 | Lam | 438/15 |
| 5,147,815 A | 9/1992 | Casto | 438/107 |
| 5,149,405 A | 9/1992 | Bruns et al. | 204/129.1 |
| 5,164,019 A | 11/1992 | Sinton | 136/249 |
| 5,189,505 A | 2/1993 | Bartelink | 257/419 |
| 5,191,405 A | 3/1993 | Tomita et al. | 257/777 |
| 5,212,115 A | 5/1993 | Cho et al. | 438/51 |
| 5,214,308 A | 5/1993 | Nishiguchi et al. | 257/692 |
| 5,219,794 A | 6/1993 | Satoh et al. | 438/126 |
| 5,220,200 A | 6/1993 | Blanton | 257/778 |
| 5,239,448 A | 8/1993 | Perkins et al. | 361/764 |
| 5,249,245 A | 9/1993 | Lebby et al. | 385/89 |
| 5,258,325 A | 11/1993 | Spitzer et al. | 438/107 |
| 5,285,105 A | 2/1994 | Cain | 257/672 |
| 5,298,460 A | 3/1994 | Nishiguchi et al. | 438/125 |
| 5,300,813 A | 4/1994 | Joshi et al. | 257/752 |
| 5,300,815 A | 4/1994 | Rostoker | 257/786 |
| 5,311,360 A | 5/1994 | Bloom et al. | 359/572 |
| 5,340,772 A | 8/1994 | Rostoker | 438/460 |
| 5,352,926 A | 10/1994 | Andrews | 257/717 |
| 5,394,303 A | 2/1995 | Yamaji | 361/749 |
| 5,399,303 A | 3/1995 | Yamaguchi et al. | 264/40.5 |
| 5,399,898 A | 3/1995 | Rostoker | 257/499 |
| 5,408,123 A | 4/1995 | Murai | 257/531 |
| 5,426,072 A | 6/1995 | Finnila | 438/107 |
| 5,438,477 A | 8/1995 | Pasch | 361/689 |
| 5,454,160 A | 10/1995 | Nickel | 29/840 |
| 5,455,445 A | 10/1995 | Kurtz et al. | 257/419 |
| 5,455,455 A | 10/1995 | Badehi | 257/690 |
| 5,461,197 A | 10/1995 | Hiruta et al. | 174/52.4 |
| 5,473,512 A | 12/1995 | Degani et al. | 361/760 |
| 5,475,236 A | 12/1995 | Yoshizaki | 257/48 |
| 5,480,839 A | 1/1996 | Ezawa et al. | 438/107 |
| 5,481,133 A | 1/1996 | Hsu | 257/621 |
| 5,491,612 A | 2/1996 | Nicewarner, Jr. | 361/760 |
| 5,508,558 A | 4/1996 | Robinette, Jr. et al. | 257/700 |
| 5,508,561 A | 4/1996 | Tago et al. | 257/737 |
| 5,508,565 A | 4/1996 | Hatakeyama et al. | 257/777 |
| 5,510,758 A | 4/1996 | Fujita et al. | 333/247 |
| 5,519,251 A | 5/1996 | Sato et al. | 257/666 |
| 5,523,619 A | 6/1996 | McAllister et al. | 257/686 |
| 5,523,628 A | 6/1996 | Williams et al. | 257/777 |
| 5,523,920 A | 6/1996 | Machuga et al. | 361/767 |
| 5,629,566 A | 5/1997 | Doi et al. | 257/789 |
| 5,744,752 A | 4/1998 | McHerron et al. | 174/52.4 |
| 6,096,576 A * | 8/2000 | Corbin et al. | 438/108 |

FOREIGN PATENT DOCUMENTS

| | | | | |
|---|---|---|---|---|
| EP | 0 304 263 A2 | 2/1989 | | H01L/25/14 |
| EP | 0 304 263 A3 | 2/1989 | | H01L/25/065 |
| EP | 0 314 437 A1 | 5/1989 | | H01L/25/08 |
| EP | 0 851 492 A2 | 7/1998 | | H01L/23/538 |
| GB | 2 117 564 A | 10/1983 | | H01L/25/08 |
| JP | 53-39068 | 4/1978 | | H01L/23/12 |
| JP | 55-111151 | 8/1980 | | H01L/27/00 |
| JP | 57-31166 | 2/1982 | | H01L/23/48 |
| JP | 57-210638 | 12/1982 | | H01L/21/60 |
| JP | 60-49638 | 3/1985 | | H01L/21/60 |
| JP | 60-94756 | 5/1985 | | H01L/25/04 |
| JP | 60-250639 | 12/1985 | | H01L/21/58 |
| JP | 61-142750 | 6/1986 | | H01L/21/60 |
| JP | 61-145838 | 7/1986 | | H01L/21/60 |
| JP | 1155637 | 6/1989 | | H01L/21/66 |
| WO | WO 90/13913 | 11/1990 | | H01L/23/10 |
| WO | WO 96/02941 | 2/1996 | | H01L/23/02 |
| WO | WO 98/05935 | 2/1998 | | G01L/9/06 |
| WO | WO 99/12208 | 3/1999 | | H01L/25/065 |

* cited by examiner

ELECTRICAL INTERFACE TO INTEGRATED CIRCUIT DEVICE HAVING HIGH DENSITY I/O COUNT

This application is a divisional of U.S. patent application Ser. No. 08/920,122, filed on Sep. 2, 1997, now U.S. Pat. No. 6,096,576 the contents of which are hereby incorporated by reference.

FIELD OF THE INVENTION

This invention relates to the field of forming electrical connections to integrated circuit devices. More particularly, this invention relates to forming an extremely large number of electrical connections to an integrated circuit using an inverted interface integrated circuit.

BACKGROUND OF THE INVENTION

As important as manufacturing an integrated circuit is the ability to apply electronic signals to and receive electronic signals from the integrated circuit. Ordinarily, an integrated circuit die is configured to have relatively large exposed metal areas, known as bonding pads, through which this electrical interface can be conducted. Often these metal areas are formed of aluminum or an aluminum alloy, which can for example 5 mils, square.

Several well known techniques are commercially used to realize such electrical interface. One such well known technique is conventionally called wire bonding. The completed die is mounted to a lead frame which is integral to the package, such as a dual-in-line package (DIP), pin grid array package (PGA), or other packages equally well known. The package includes individual pins or other electrical contact devices that are configured for ready coupling to an external circuit or circuit board through soldering, socketing or other well known means. Electrical contact is made between the bonding pads and the lead frame by attaching a thin wire between these contacts. The wire is attached to the bonding pads and the lead frame by heating or ultrasonically welding the wire to the pads. Unfortunately, the bonding wire introduces impedance into the path of an electric signal due to its thinness and length. The bonding wire acts as an inductor. This impedance operates to add noise to the signal, thereby decreasing the overall operating efficiency of a system including bonding wires. Further, because of the physical requirements of the wire and the potential for undesired contact between adjacent wires, the spacing requirements are restrictive. The bonding pads are positioned near the edges of the die to allow a shortest path for the bonding wire. The bonding wire can also act as an antenna.

Another well known technique is commonly known as flip chip bonding. According to flip chip bonding, a substrate such as a printed circuit board includes electrically conductive lands that are formed into a mirror image of the bonding pads on an integrated circuit. Generally, the bonding pads are treated with a layer of solder. The integrated circuit and the substrate are mounted in a face-to-face relation to one another and the solder is melted with heat to join the bonding pads and to the corresponding land. In this way, the bonding pads and the lands necessarily provide electrical contact from the integrated circuit to the substrate. Unfortunately, electrical interconnection between two integrated circuits on a printed circuit board, each die using flip chip bonding, requires signal traces along the substrate. These traces, such as on a printed circuit board, introduce impedance into the path of the electric signals and operate to slow the transmission of the signals, thereby decreasing the overall operating efficiency of such a system.

Others have proposed chip to chip bonding techniques. For example, U.S. Pat. No. 5,399,898 to Rostoker discloses a multi-chip semiconductor arrangement using flip chip dies. Rostoker teaches arrangements using double sided flip chips which have raised bumps on both sides and single sided flip chips which have raised bumps on one side. The double sided flip chips are mounted on the substrate and the single sided flip chips bridge the gap between the double sided flip chips with minimal overlap. The Rostoker invention suffers from the several difficulties in implementation. For example, an upper integrated circuit must be mounted as a bridge between two integrated circuit dice. This requires such an assembly to consume considerable surface area on a substrate such as a printed circuit board, or requires an atypically large integrated circuit package to contain such an assembly. In addition, the upper integrated circuit must be manufactured using complex processing techniques that form electrically conductive vias through the body of that integrated circuit. Such techniques are complex and thus expensive to perform. Electrical connection to this assembly is made to the back of the upper integrated circuit using for example conventional wire bonding techniques.

Still others have proposed techniques for reducing the volume and thus surface area consumed by multiple integrated circuit devices. One such technique is taught in U.S. Pat. No. 5,491,612 to Nicewarner, Jr. This technique is not concerned with the number of interconnections between integrated circuits but rather the volume of space consumed by plural integrated circuits. Nicewarner teaches a three dimensional modular assembly of integrated circuits. The chips are mounted back to back and are mounted on both sides of the primary substrate and between each of the two secondary substrates and the primary substrate. Because of the design, the array of chips between the primary substrate and the first secondary substrate must mirror the array of chips between the primary substrate and the second secondary substrate.

Yet others have proposed stacking integrated circuits one on top of another. Such techniques include forming interconnections along the sides of the stack. Heat dissipation from an integrated circuit within the stack can become a problem.

An emerging technology surrounds semiconductor micromachines that are used for forming displays. A device that can be used for such a display is disclosed in U.S. Pat. No. 5,311,360 which is incorporated in its entirety herein by reference.

According to the teachings of the '360 patent, a diffraction grating is formed of a multiple mirrored-ribbon structure such as shown in FIG. 1. A pattern of a plurality of deformable ribbon structures 100 are formed in a spaced relationship over a substrate 102. Both the ribbons and the substrate between the ribbons are coated with a light reflective material 104 such as an aluminum film. The height difference that is designed between the surface of the reflective material 104 on the ribbons 100 and those on the substrate 102 is $\lambda/2$ when the ribbons are in a relaxed, up state. If light at a wavelength $\lambda$ impinges on this structure perpendicularly to the surface of the substrate 102, the reflected light from the surface of the ribbons 100 will be in phase with the reflected light from the substrate 102. This is because the light which strikes the substrate travels $\lambda/2$ further than the light striking the ribbons and then returns $\lambda/2$, for a total of one complete wavelength $\lambda$. Thus, the structure appears as a flat mirror when a beam of light having a wavelength of $\lambda$ impinges thereon.

By applying appropriate voltages to the ribbons 100 and the substrate 102, the ribbons 100 can be made to bend toward and contact the substrate 102 as shown in FIG. 2. The thickness of the ribbons is designed to be $\lambda/4$. If light at a wavelength $\lambda$ impinges on this structure perpendicularly to the surface of the substrate 102, the reflected light from the surface of the ribbons 100 will be completely out of phase with the reflected light from the substrate 102. This will cause interference between the light from the ribbons and light from the substrate and thus, the structure will diffract the light. Because of the diffraction, the reflected light will come from the surface of the structure at an angle $\Theta$ from perpendicular.

It will become apparent to one of ordinary skill in the art after studying the teachings of the '360 patent that the structure shown in FIG. 1 can be used to represent a single pixel of a display. A typical display can contain 1024×1280 pixels arranged in an array of rows and columns. A semiconductor device using pixels such as shown in FIG. 1 and having 1024×1280 pixels can have an array that is approximately 1 inch by 1.3 in extent. Such a device will likely require at least 2310 I/O structures (1024+1280+6). The additional 6 I/O pins are for specialized biasing. Using conventional wire bonding bond pad structures, the surface area necessary for making connection to such a device can exceed the active display area by several times. Because the cost to manufacture the device is primarily born by the active display area, such an expense of surface, area is excessive and undesirable. To solve this problem, it is undesirable to manufacture driver structures on the same semiconductor substrate as the active display area. This is due to two primary reasons. First, the cost to manufacture the devices in the active display area is greater than to manufacture electronic circuit components for making drivers using conventional well known techniques. Second, the processing steps are not the same to manufacture the active display area as for electronic circuit components. Thus, a processing specification for such a device would be extremely complex. This would tend to further reduce the yield of such a structure and thereby further increase the cost. For these reasons, it is preferred that the drive electronics be placed in a separate integrated circuit.

Interconnections to such a device could not require the electrically conductive vias nor the bridging technique taught by Rostoker. Further, such an interconnecting structure could not function using a stacked arrangement because light would not be able to impinge onto the surface of the active display area.

What is needed is a method of and apparatus for providing electrical interconnections directly from one integrated circuit to another.

What is also needed is a method of and an apparatus for providing electrical interconnections to an integrated circuit with extremely high I/O requirements.

What is further needed is a method of and an apparatus for providing electrical interconnections to an integrated circuit without obscuring the surface of the integrated circuit.

SUMMARY OF THE INVENTION

A method of and an apparatus for electrically interconnecting two integrated circuits devices includes mounting the two devices face to face. A first device is mounted for example to a substrate or lead frame. The first device includes a plurality of electrical/physical mounting structures preferably positioned along one edge. The mounting structures provide both electrical interconnection and physical mounting. A second device includes a corresponding plurality of mounting structures configured as a mirror image of the mounting structures on the first device. The mounting structures on the second device are also positioned along one of its edges so that once the mounting structures are brought together in a face to face relationship, the second device cantilevers off the edge of the first device. Under certain circumstances, a dummy block can be mounted to the substrate adjacent to the first device to act as a strut or support for the second device. Under certain other circumstances, an epoxy potting compound can be used to provide structural support. The mounting structures can be positioned sufficiently close to one another that surface area consumed for I/O is minimized. Another set of electrical interconnect structures can be formed on the surface of the second device on the edge opposite the mounting structures. Electrical connection can be formed to these electrical interconnect structures using conventional techniques such as tape automated bonding (TAB) or flex connections.

DETAILED DESCRIPTION OF THE PREFERRED EMBODIMENT

Figure 1:
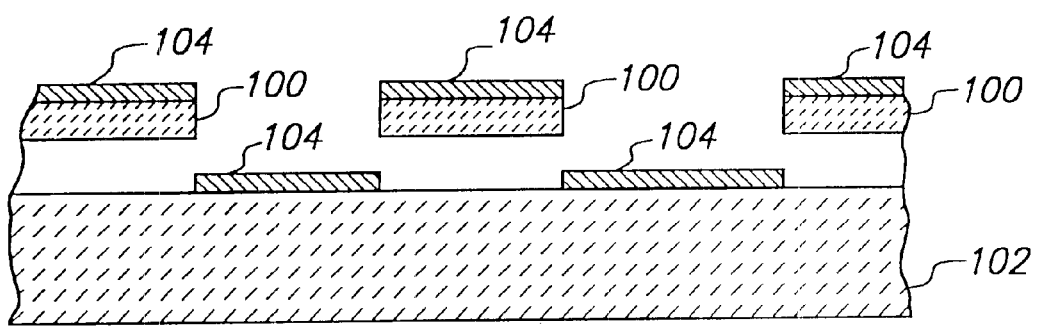
FIG. 1 shows a pixel structure from a prior art semiconductor micromachine display device.
Figure 2:
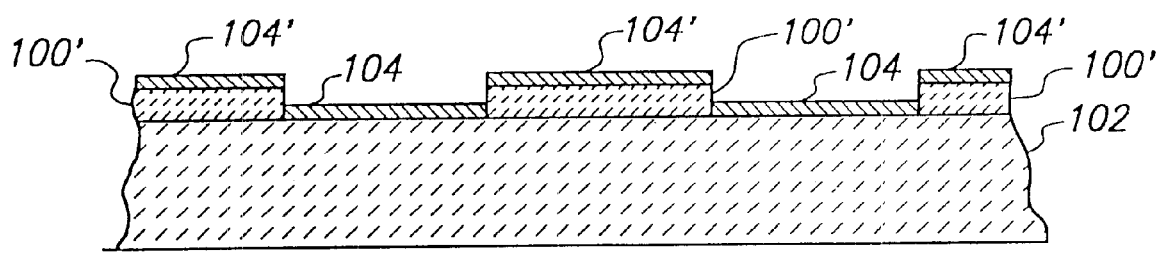
FIG. 2 shows the structure of FIG. 1 under a biased condition.
Figure 3:
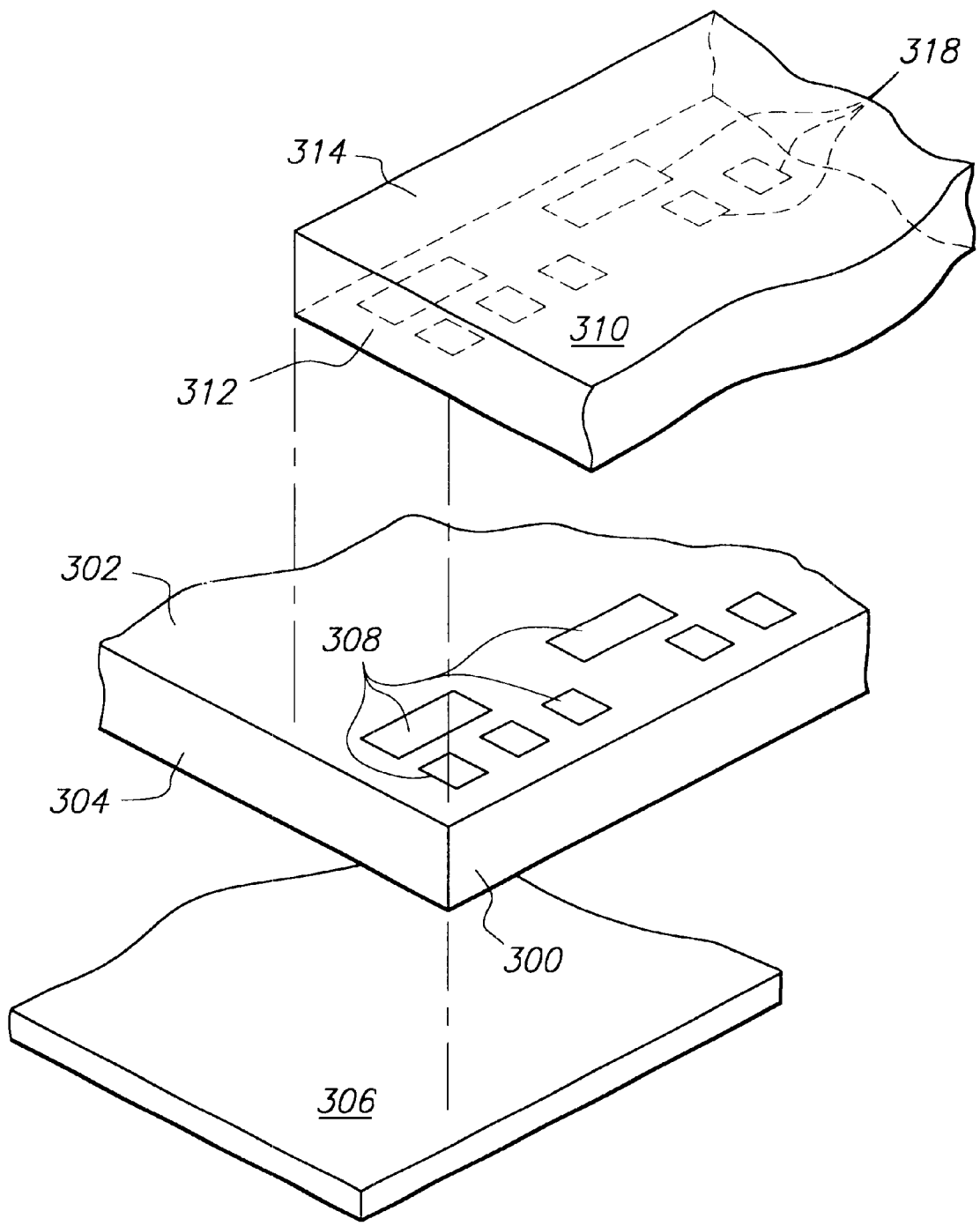
FIG. 3 shows an exploded partial perspective view of the preferred embodiment of the present invention.

FIG. 3 shows an exploded partial perspective view of the preferred embodiment of the present invention. A first semiconductor device 300 is substantially planar and includes a primary face 302 and a secondary face 304. An integrated circuit device (not shown) is formed in the primary face 302 of the first semiconductor device 300. The integrated circuit formed on the first semiconductor device 300 can be of any type of circuit but is preferably of a semiconductor micromachine display device. However, it will be apparent to one of ordinary skill in the art that the first integrated circuit device 300 could be another conventional circuit such as a microprocessor, controller, PAL, PLA, dynamic or nonvolatile memory and the like.

The first semiconductor device 300 is mounted by its secondary surface 304 to a substrate 306 as shown by the dash-dot-dash line. The substrate can be of any convenient form such as a printed circuit board, a ceramic or an IC package. A plurality of electrical/physical mounting structures 308 are formed near one edge on the primary surface 302 of the semiconductor device 300. The mounting structures 308 are preferably formed of a metal using conventional semiconductor processing techniques. The mounting structures 308 are electrically coupled to the integrated circuit (not shown) using conductive traces (either metallic or doped semiconductor). The mounting structures 308 can be conveniently formed of aluminum or an aluminum alloy. Other metals can also be used.

A second semiconductor device 310 is substantially planar and includes a primary face 312 and a secondary face 314. An integrated circuit device (not shown) is formed in the primary face 312 of the second semiconductor device 310. The integrated circuit formed on the second semiconductor device 310 can be of any type of circuit but is preferably of a driver circuit for a semiconductor micromachine display device. However, it will be apparent to one of ordinary skill in the art that the second integrated circuit device 310 could be another conventional circuit such as a microprocessor, controller, PAL, PLA, dynamic or nonvolatile memory and the like.

The primary surface 312 of the second semiconductor device 310 is mounted to the primary surface 302 of the first semiconductor device 300 as shown by the dash-dot-dash line. As can be readily seen the second semiconductor device 310 cantilevers off the edge of the first semiconductor device 300 in an overhanging manner. This limits the amount of the primary surface 302 of the first semiconductor device 300 that is consumed with forming electrical connections to the integrated circuit on the semiconductor device 300. Because of the techniques described herein, the size of the mounting structures 308 can be as small as 50 microns on a side. The spacing between adjacent mounting structures 308 can be limited to 50 microns.

A plurality of electrical/physical mounting structures 318 are formed near one edge on the primary surface 312 of the semiconductor device 310. The mounting structures 318 and portions of the second semiconductor device 310 along with their respective lead lines are shown as ghost lines to indicate that those structures are hidden from view. The mounting structures 318 are preferably formed of a metal using conventional semiconductor processing techniques. The mounting structures 318 are electrically coupled to the integrated circuit (not shown) using conductive traces (either metallic or doped semiconductor). The mounting structures 318 can be conveniently formed of gold or a solderable alloy. Other metals can also be used.

The mounting structures 318 formed in the second semiconductor device 310 are configured in a mirror image to the mounting structures 308 that are formed on the first semiconductor device 300. In this way, when the first semiconductor device 300 and the semiconductor device 310 are brought together in a face to face relation, the mounting structures 308 and 318 will join together electrically and physically.

Figure 4:
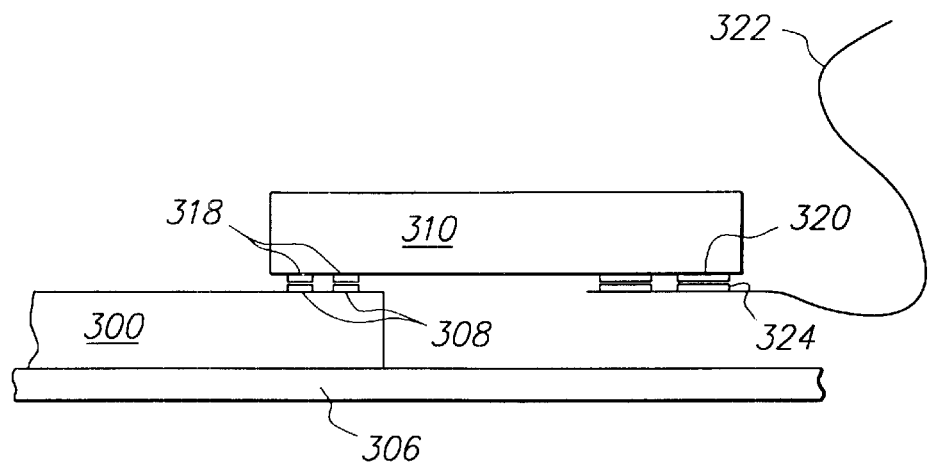
FIG. 4 shows a side view of a first embodiment of the present invention.

FIG. 4 shows a side view of the structure of FIG. 3. Where appropriate, the same reference numerals will be used to identify identical structures to avoid obscuring the invention in extraneous detail. Note that a large portion of the first semiconductor device 300 is exposed. This is particularly ideal for the preferred embodiment of the present invention where the integrated circuit is a semiconductor micromachine display device. Under such circumstances, it is essential that the integrated circuit be exposed to receive and reflect or diffract light.

In addition to the structural elements discussed above relative to FIG. 3, FIG. 4 also shows an electrical interconnection made from other systems to the second semiconductor device 310. A second plurality of mounting structures 320 are formed on the primary surface 312 of the second semiconductor device 310. Preferably, the mounting structures are located on an edge opposite those of the mounting structures 318. As shown, the size and spacing of the second plurality of mounting structures 320 need not be identical to that for the mounting structures 318. A flexible tape connector 322 includes a corresponding set of mounting structures 324 that are configured as a mirror image to those of the mounting structures 320. The flexible tape connector 322 is coupled to the second semiconductor device 310 in the conventional manner.

The process for forming the structure of FIGS. 3 and 4 follows. Separately, the first and the second semiconductor devices 300 and 310 are formed using semiconductor processing steps known and described in detail elsewhere. Either the mounting structures 308 or the mounting structures 318 or both include a mounting substance such as solder. Once completed, the first semiconductor device 300 is mounted to the substrate 306. Separately, a flexible tape connector 322 is mounted to the second semiconductor device 310. Once these two subassemblies are formed, the second semiconductor device 310 with the flexible tape connector 322 are brought to the first semiconductor device 300. The mounting substance is melted with heat or ultrasonically to join the mounting structures 308 and 318 electrically and physically.

Figure 5:
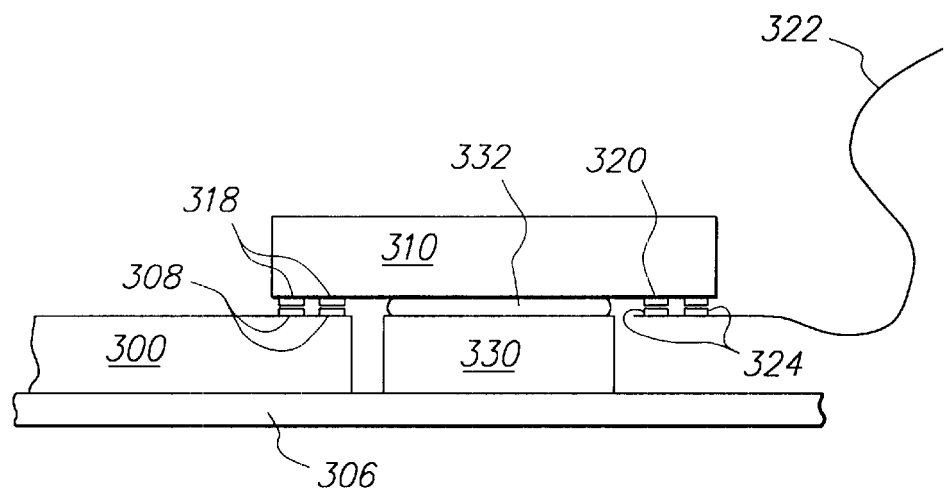
FIG. 5 shows a side view of a second embodiment of the present invention.

Under certain circumstances, it may be determined that the strength of the joined mounting structures 308 and 318 will be insufficient to hold the second semiconductor device 310 in place without failing. Under those circumstances a support structure 330 is used as shown in FIG. 5. The support structure 330 is mounted adjacent the edge of the first semiconductor device 300 to which the second semiconductor device 310 is mounted. The support structure 330 can be formed of a dummy block of semiconductor material or can be formed of a defective/non-functioning device such as the first semiconductor device 300. It is desirable that the height of the support structure 330 approximate that of the first semiconductor device 300. An adhesive material 332 is placed on an upper surface of the support structure 330 to hold the second semiconductor device 310 in place. Preferably, the adhesive 332 is formed of a compressible material so that it will conform to an ideal height for supporting the second semiconductor device 310.

Figure 6:
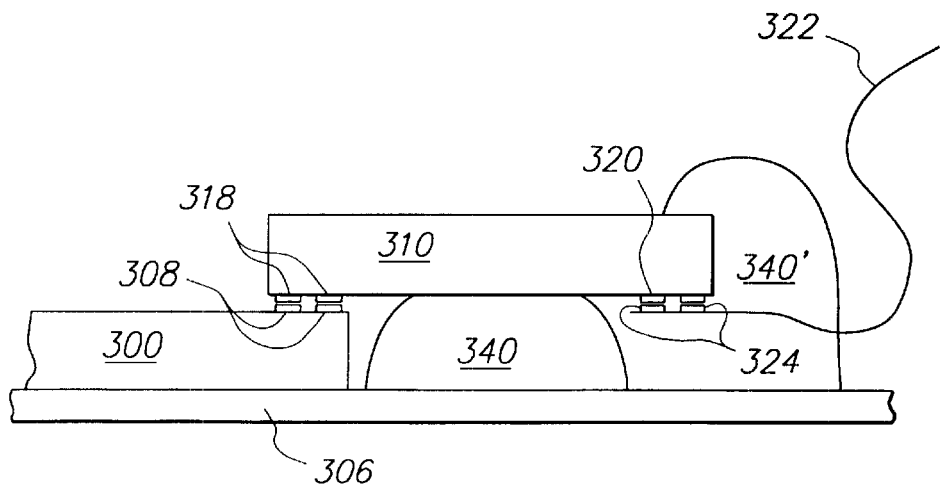
FIG. 6 shows a side view of a third embodiment of the present invention.

As an alternative to the structure shown in FIG. 5, where it is determined that the strength of the joined mounting structures 308 and 318 will be insufficient to hold the second semiconductor device 310 in place without failing, a potting compound 340 can be used as shown in FIG. 6. Preferably, an epoxy potting compound is used. Under those circumstances, the support structure 330 shown in FIG. 5 can be replaced with the potting compound 340. Like the support structure 330, the potting compound 340 is mounted adjacent the edge of the first semiconductor device 300 to which the second semiconductor device 310 is mounted. Preferably, the electrical interconnection 322 is coupled to the second semiconductor device 310 before the potting compound is applied. The potting compound 340 can be limited to the region under the second semiconductor device 310, can extend up and over the second semiconductor device 310 as shown at reference numeral 340' or in between. Because the preferred embodiment of the present invention is intended for applications wherein the first semiconductor device 300 is configured to reflect light, it is important in such applications that the potting compound 340 and/or 340' not cover the first semiconductor device 300.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiments chosen for illustration without departing from the spirit and scope of the invention.

Specifically, it will be apparent to one of ordinary skill in the art that the device of the present invention could be implemented in several different ways and the apparatus disclosed above is only illustrative of the preferred embodiment of the invention and is in no way a limitation. For example, it would be within the scope of the invention to vary the materials and structures of the various components disclosed herein.

What is claimed is:

1. An electrical system comprising:
   a. a first substantially planar substrate having a first primary surface, having a first integrated circuit formed in the first primary surface, and having a secondary surface opposite to the first primary surface, wherein a first plurality of integrated circuit electrical contacts are positioned along a first edge of the first primary surface;
   b. a second substantially planar substrate having a second primary surface, and having a second integrated circuit formed in the second primary surface, the second primary surface having a third edge opposite a second edge, wherein a second plurality of integrated circuit electrical contacts are positioned along the second edge of the second primary surface; and
   c. an electrical interface for electrically coupling the first plurality of integrated circuit electrical contacts in a face to face relationship with the second plurality of integrated circuit electrical contacts such that the first substantially planar substrate overlaps the second substantially planar substrate only in a region of the first and second integrated circuit electrical contacts but is not substantially overlapping otherwise such that the third edge is substantially unsupported wherein the second substantially planar substrate cantilevers off the edge of the first substantially planar substrate.

2. The electrical system according to claim 1 wherein the first integrated circuit comprises a multiple mirrored-ribbon structure and wherein the second integrated circuit comprises a driver circuit for coupling to and controlling the first integrated circuit.

3. The electrical system according to claim 1 further comprising a third substantially planar substrate wherein the first secondary surface is mounted to the third substantially planar substrate.

4. The electrical system according to claim 1 further comprising a third plurality of integrated circuit electrical contacts positioned along the third edge for coupling to a flexible tape structure.

5. The electrical system according to claim 1 wherein each of the first and second pluralities of integrated circuit electrical contacts are positioned sufficiently close to one another that a minimum surface area is consumed for input/output circuitry.

6. The electrical system according to claim 1 further comprising a non-electrical support structure coupled to and mounted underneath the second substantially planar substrate to hold the second substantially planar substrate in place.

7. A cantilevered flip-chip assembly for exposing a multiple mirrored ribbon structure formed on a surface of a semiconductor substrate and for coupling the multiple mirrored ribbon structure to a driver circuit, wherein the multiple mirrored-ribbon structure is controlled by the deliver circuit, the cantilevered flip-chip assembly comprising:
   a. a first substantially planar substrate having a first surface on which first circuit elements including the multiple mirrored-ribbon structure are formed, wherein a first plurality of integrated circuit electrical contacts are positioned along a first edge of the first primary surface and coupled to the first circuit elements; and
   b. a second substantially planar substrate having a second surface on which second circuit elements including the driver circuit are formed, the second primary surface having a third edge opposite a second edge, wherein a second plurality of integrated circuit electrical contacts are positioned along the second edge of the second primary surface for coupling to the first plurality of integrated circuit electrical contacts in a face to face relationship such that the second substantially planar substrate partially overlaps the first substantially planar substrate in a region of the first and second plurality of integrated circuit electrical contacts.

8. The cantilevered flip-chip assembly according to claim 7 further comprising a third plurality of integrated circuit electrical contacts positioned along the third edge of the second substantially planar substrate for coupling to a flexible tape structure and for making external connections to other integrated circuits.

9. The cantilevered flip-chip assembly according to claim 7 further comprising a non-electrical support structure coupled to and mounted underneath the second substantially planar substrate for holding the second substantially planar substrate in place.

10. The cantilevered flip-chip assembly according to claim 9 wherein the non-electrical support structure is formed of a block of semiconductor material.

11. The cantilevered flip-chip assembly according to claim 10 wherein the non-electrical support structure is formed of a potting compound.

12. The cantilevered flip-chip assembly according to claim 11 wherein the potting compound is an epoxy potting compound.

* * * * *